MULTI-JUNCTION NEGATIVE RESISTANCE SEMICONDUCTING DEVICES

Filed Oct. 15, 1959 2 Sheets-Sheet 1

INVENTORS
PAUL RAPPAPORT AND
EDWARD PASIERB, JR.
BY
W.S. Hill
AGENT

INVENTORS
PAUL RAPPAPORT AND
EDWARD PASIERB, JR.
BY
W.S. Hill
AGENT

United States Patent Office 3,187,193

Patented June 1, 1965

3,187,193

MULTI-JUNCTION NEGATIVE RESISTANCE SEMICONDUCTING DEVICES

Paul Rappaport, Princeton, and Edward Pasierb, Jr., Trenton, N.J., assignors to Radio Corporation of America, a corporation of Delaware Filed Oct. 15, 1959, Ser. No. 846,665
4 Claims. (Cl. 307—88.5)

This invention relates to novel and improved abrupt junction semiconducting devices exhibiting negative resistance characteristics over a range of low bias voltages and to electronic circuits including these devices wherein the negative resistance characteristics thereof are used.

Abrupt p-n junction devices have been previously described which exhibit a negative resistance characteristic when biased with low forward voltages; i.e., less than 0.3 volt, and a highly conducting characteristic when biased with voltages in the backward direction. These abrupt p-n junction devices are referred to as tunnel diodes, and comprise a semiconductor body having therein an abrupt p-n junction wherein the free charge carrier concentrations on both sides of the junction are several orders of magnitude higher than those used in conventional junction devices. For example, in such a device utilizing a germanium semiconductor body, the p-n junction is less than 200 A. thick and the concentration of free charge carriers on both sides of the junction is greater than $1.0 \times 10^{19}$ carriers/cm.$^3$.

An object of this invention is to provide abrupt junction semiconductor devices exhibiting several negative resistance regions over a range of operating voltages.

A more specific object is to provide abrupt junction semiconductor devices exhibiting a plurality of negative resistance regions over a range of forward operating voltages with respect to the device and to circuits using said characteristics.

Another more specific object is to provide abrupt junction semiconductor devices exhibiting a negative resistance region over a range of voltages including the forward and backward directions with respect to the device and to circuits using said characteristics.

Another more specific object is to provide abrupt junction semiconductor devices exhibiting sensitivity to light and other types of radiation and/or heat and to circuits using said characteristics.

In general, the devices herein comprise a single crystal body of semiconductor material such as germanium or gallium arsenide, and a plurality of abrupt p-n junctions in operative relationship therewith, each junction being characterized by exhibiting a negative resistance characteristic when separately biased in a range of low voltages in the forward direction. If a varying voltage is applied across two of said abrupt p-n junctions the device exhibits a negative resistance region in each of the forward and backward directions of applied voltage with respect to the device. If one or more additional abrupt p-n junctions are directly connected with one of the foregoing p-n junctions, then a number of negative resistance regions corresponding to the number of p-n junctions occur in the corresponding direction of biasing.

The foregoing device may also include a non-rectifying or ohmic electrode contacting said semiconductor body. If the abrupt p-n junctions are connected together and a range of voltage is applied between the non-rectifying electrode and the abrupt p-n junctions connected together, then the device exhibits a corresponding number of negative resistance regions in the forward direction corresponding to the number of abrupt p-n junctions in the device.

The position of the negative resistance region for each abrupt p-n junction is predetermined by the resistance in series with the particular junction. By another feature of the invention, a large and predetermined resistance in series with each junction may be permanently built into the device. To this end the device comprises a high resistivity semiconductor body having a very thin surface diffused region having a normal free charge carrier content sufficiently high to provide one side of an abrupt negative resistance p-n junction, and at the same time a high lateral resistivity in the dark. The resistivity in series with each junction may be reduced by introducing light or heat to the diffused region, thereby shifting the negative resistance region to a lower voltage range. When properly biased, the device may thereby function as a light or heat sensing device.

The invention includes also circuits for obtaining and using plural negative resistance regions with the devices herein.

The invention is more fully described in the following detailed description and drawing, in which.

Similar reference numerals are used for similar structures throughout the drawings.

Figure 1A:
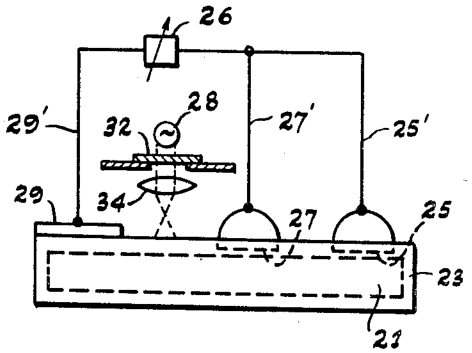
FIGURE 1A is a partially elevational, partially schematic view of a typical device of the invention with the p-n junctions connected together to one side of a variable voltage source (parallel connection)

A typical device of the invention is illustrated in FIGURE 1A. The device comprises a body 21 of semiconductor material including a region 23, a non-rectifying base electrode 29 contacting the region 23, a base electrode lead 29' connected to the base electrode 29, a pair of abrupt p-n junctions 25 and 27 in the region 23, each juncton being of the type which exhibits a negative resistance characteristic at low forward bias voltage. The diffused region 23 is characterized by having a very high free charge carrier concentration adjacent the p-n junctions 25 and 27 and a relatively high lateral resistance between the junctions 25 and 27 and the electrode 29. The edge of each junction is spaced a different distance from the edge of said non-rectifying electrode 29, and junction leads 25' and 27' are connected to the junctions 25 and 27 respectively.

The device of FIGURE 1A may be prepared by a diffusion-alloying technique. A single crystal body 21 of gallium arsenide of almost any resistivity or purity is heated in an atmosphere containing zinc vapor at temperatures between 600° C. to 1100° C. and for times of 1 to 20 hours, for example, at 1000° C. for 1 hour. During the heating, zinc diffuses into the body 21 producing a diffused region 23 having a high zinc impurity concentration. The diffused region 23 is p-type with a free hole concentration greater than $10^{18}$ holes/cm.$^3$ and a relatively high lateral resistivity. After cooling, two tin-tellurium dots about 0.05 cm. in diameter and containing 50 mol percent tellurium are placed in desired positions on the diffused surface and alloyed thereto in the shortest possible period of time at the lowest possible temperature to produce the abrupt p-n junctions 25 and 27. It has been found convenient to heat the assembly to just above the melting point (about 780° C.) of the dots and then cool immediately. A non-rectifying (ohmic) electrode 29 is applied by evaporating or melting either indium or gallium in the desired position on the diffused surface. Leads 25', 27', and 29' are then attached to the dots 25 and 27 and the electrode 29 by soldering.

The devices herein may comprise a semiconducting body of any of the semiconducting III–V compounds or of germanium or silicon. In the case of gallium arsenide and other III–V compounds, other materials which render the body p-type may be used in place of zinc, for example, cadmium and mercury. Other materials which render the body n-type may be used in place of tellurium, for example, sulfur and selenium. In the case of germanium and silicon, the usual p-type and n-type impurities may be used to prepare the p-n junction.

Figure 2:
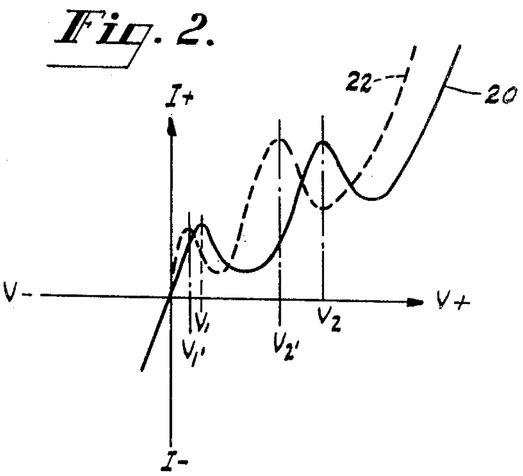
FIGURE 2 is a graph showing the voltage-current characteristic typical of the device and circuit of FIGURE 1A.

FIGURE 2 illustrates the voltage-current characteristic in the dark of the device of FIGURE 1A with the p-n junctions 25 and 27 in parallel connection as shown in FIGURE 1A. The two p-n junction leads 25' and 27' are connected together and to one side of a variable voltage source 26. The other side of the variable voltage source 26 is connected to the base electrode lead 29'. The voltage-current characteristic is shown by the solid curve 20. As the voltage increases in the backward direction, the device exhibits only a low impedance to current flow. As the voltage increases in the forward direction, the current rises to a maximum at voltage $V_1$, then drops off, rises to a second maximum at $V_2$, then again drops off, and then rises again. With a spacing of about 0.1 cm. between the p-n junctions and of 0.2 cm. between the base electrode 29 and the nearest p-n junction, typical values of $V_1$ and $V_2$ are about 1.5 and 3.0 volts with currents of about 10 and 15 milliamperes respectively.

It is believed that the height and spacing of the peaks at $V_1$ and $V_2$ are related to the series resistance of the diffused region 23 between the base electrode 29 and each p-n junction 25 and 27. To illustrate this relationship, the same conditions are applied to the device except that, instead of being conducted in darkness, the light from a 100 watt bulb 28 six inches away was focussed through a shutter 32 and a lens 34 upon the surface of the diffused region 23. This irradiating light provides about 300 milliwatts/cm.$^2$ at the device. The voltage-current characteristic is illustrated by the dotted curve 22 of FIGURE 2. The curve 22 is the same as the curve 20 except that it appears to be compressed towards the ordinate for zero applied voltage. This compression is interpreted to result from a lowering of the resistance in the diffused region 23 due to the presence of light.

Since the voltage peak can be shifted by the presence of light, the device of FIGURE 1A may be used as a photoswitch or other type of light sensing device in various arrangements. One arrangement, as illustrated in FIGURE 1A, is to bias one junction, say junction 25 to just below $V_2$. Light, *hν*, is directed upon the diffused region 23 between the junction 25 and the base connection 29, on either or both sides of the other junction 27 as with a lens 34 or other light-directing means. When light strikes this diffused region, the junction 25 trips into a conducting mode by virtue of being biased above $V_{2'}$. In the alternative case, the junction 27 is biased to just below $V_1$ in FIGURE 2. With light present, the junction 25 trips into the conducting mode since the bias is greater than $V_1$.

This photosensitive characteristic can be used as a switch either between a relatively conducting and nonconducting or between oscillating and non-oscillating modes of operation depending upon the load in the external circuit.

The same shift in characteristic may also be obtained by heating the device instead of irradiation with light. Thus, the device may also be used as a heat-activated switch.

It is believed that the height and spacing of the peaks at $V_1$ and $V_2$ are also related to the area of the junctions 25 and 27. A larger junction area will pass more current. A higher current in the diffused region between the base electrode 29 and the particular p-n junction displaces the peak of the curve for that junction to a lower voltage value and, of course, a higher current value. With smaller junction areas the converse is true.

Figure 1B:
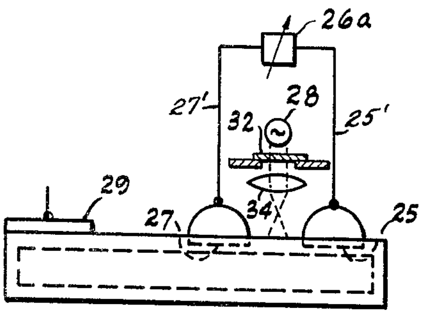
FIGURE 1B is the same device with the p-n junctions connected to opposite sides of a variable voltage source (series connection)
Figure 3:
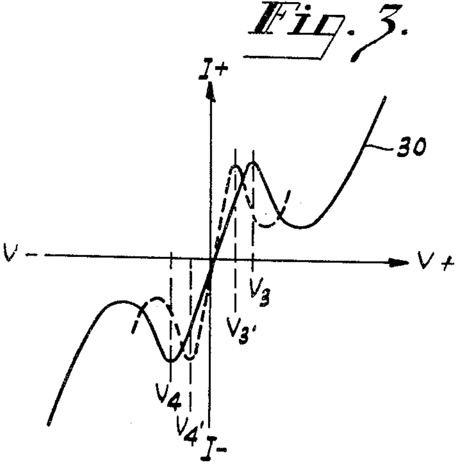
FIGURE 3 is a graph showing the voltage-current characteristic typical of the device and circuit of FIGURE 1B.

FIGURE 3 illustrates the voltage-current characteristic of the device of FIGURE 1B with the p-n junctions 25 and 27 in series connection. By series connection is meant that the junctions are biased in opposite polarity. The two p-n junction leads 25' and 27' are connected to opposite sides of a variable voltage source 26a. The base lead 29' is not connected. As the voltage increases in the backward direction with respect to junction 27 (which is the forward direction with respect to junction 25), the current rises to a maximum absolute value, at voltage $V_4$, then decreases in absolute value, then increases again. As the voltage increases in the forward direction with respect to junction 27 (which is the backward direction with respect to junction 25), the current rises to a maximum absolute value at $V_3$, drops off and then rises again. Thus, the device exhibits a negative resistance region in both the backward and forward directions. With a spacing of about 0.1 cm. between the p-n junctions 25 and 27, in one instance values of $V_3$ and $V_4$ were about $-1.5$ and $+3.0$ volts with currents of about $-10$ and $+10$ milliamperes respectively. The height and spacing of the peaks at $V_3$ and $V_4$ is dependent on the series resistance of the diffused region and the areas of the junctions as described above.

The devices herein may be fabricated and connected in many other ways. For example, FIGURE 4A illustrates another method of fabrication and another arrangement of connections.

Figure 4A:
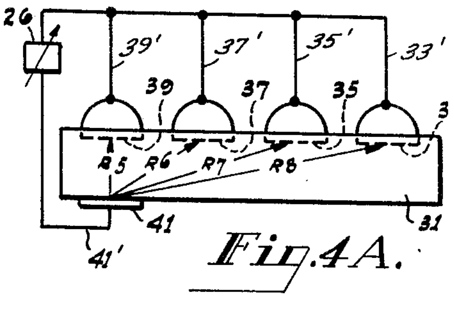
FIGURE 4A is an elevational view of a novel device herein having four abrupt p-n junctions.

The device of FIGURE 4A comprises a single crystal semiconducting body 31, for example n-type germanium substantially uniformly doped with arsenic to have a free electron concentration of about $2.0\times10^{19}$/cm.$^3$ on the surface but several orders of magnitude less in the bulk. In addition the lateral resistivity along the surface should be relatively high. The body 31 has two opposed faces. Four spaced abrupt p-n junctions 33, 35, 37 and 39 are located on one face of the body 31. Such junctions may be produced in germanium by alloying thereto 0.01 cm. diameter dots of an alloy containing 99 weight percent indium, 0.5 weight percent zinc, and 0.5 weight percent gallium at about 450° C. for one minute in a dry hydrogen atmosphere. Junction leads 33', 35', 37' and 39' are then connected to the excess alloy on the outer side of each junction respectively as by soldering. A small area to one side of the other opposed face of the body 31 is provided with an ohmic (non-rectifying) base electrode 41 as by soldering thereto a strip of nickel using lead-tin-arsenic solder. The ohmic electrode 41 is positioned to be located a different distance from each of the p-n junctions, thereby providing different resistances R8, R7, R6 and R5 in the paths between the ohmic electrode 41 and each p-n junctions 33, 35, 37 and 39 respectively. Leads 33', 35', 37', 39' and 41' are connected to the p-n junctions 33, 35, 37, 39 and the ohmic electrode 41 respectively.

Figures 5, 6, 7:
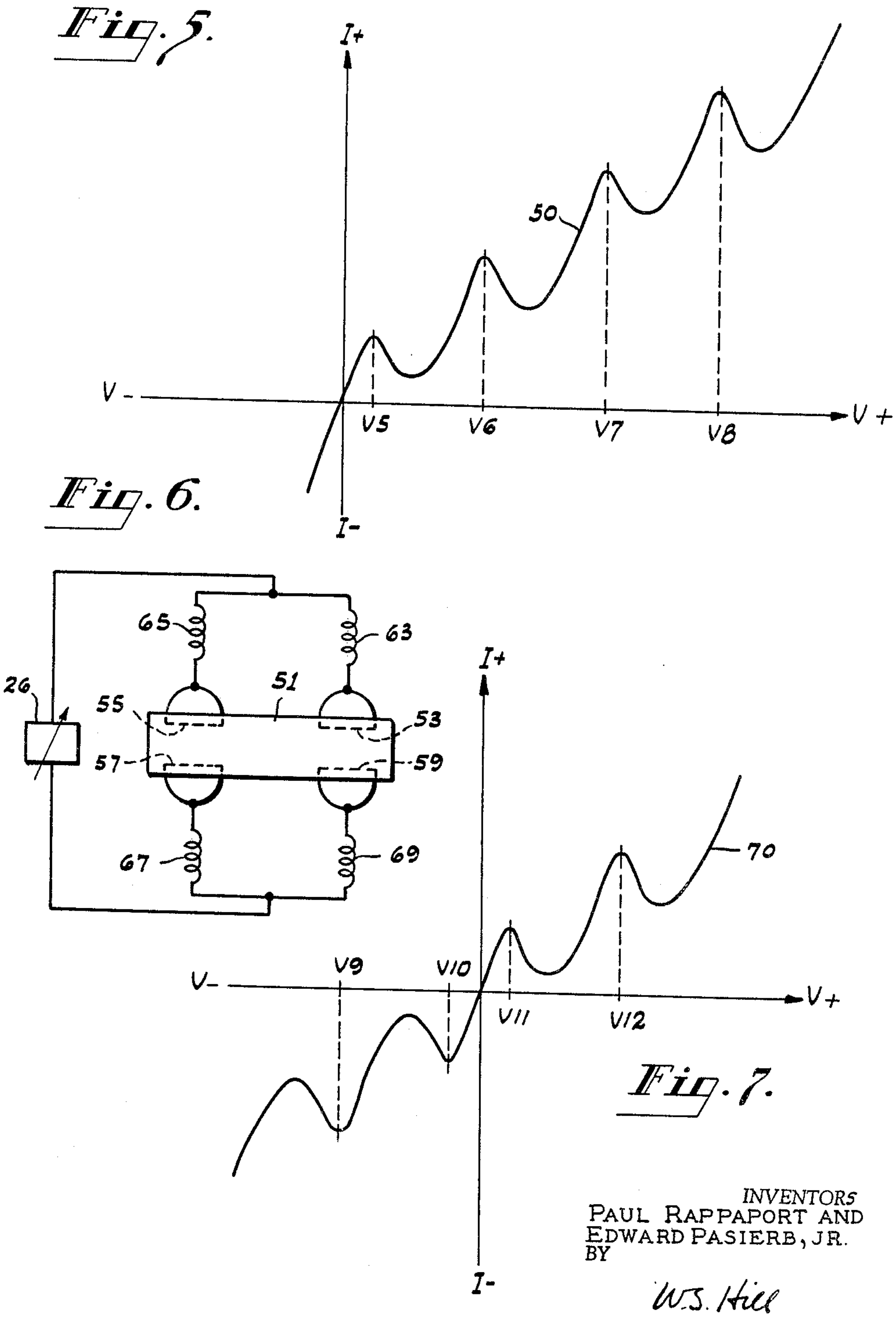
FIGURE 5 is a graph showing the voltage-current characteristic of the device of FIGURE 4A with the p-n junctions connected together and a range of voltage applied across the non-rectifying electrode and the p-n junctions.
FIGURE 6 is an elevational view of another embodiment of the novel devices herein, in another oscillator circuit; and, FIGURE 7 is a graph showing the voltage-current characteristic of the device of FIGURE 4 with two sets of p-n junctions connected together and a range of voltage applied across the two sets of junctions.

If the junction leads 33', 35', 37' and 39' are connected together to one side of a variable voltage source 26 and the base electrode 41 is connected to the other side of the voltage source, then the device will exhibit a voltage-current characteristic as shown in FIGURE 5. The device exhibits four negative resistance regions. The values of the voltage peaks $V_5$, $V_6$, $V_7$ and $V_8$ which are a function of the magnitude of the series resistances R5, R6, R7 and R8 respectively and the areas of the respective junctions.

Figure 4B:
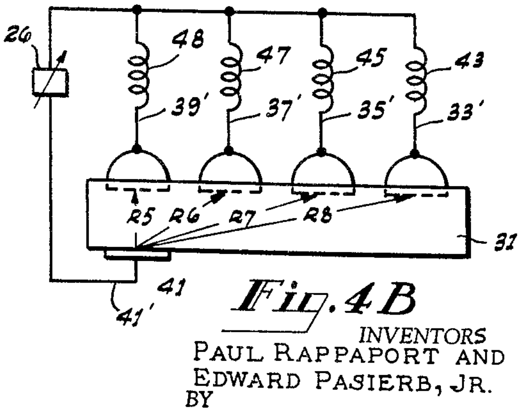
FIGURE 4B is an elevational view of the novel device of FIGURE 4A, in an oscillator circuit.

FIGURE 4B shows four junction devices of FIGURE 4A in an oscillator circuit. Each junction 33, 35, 37 and 39 is connected to its own inductor 43, 45, 47 and 49 which is then connected to the positive terminal of a variable voltage source 26. The negative terminal of the voltage source is connected to the base electrode 41. The value of each inductance and the capacitance associated with each junction determines the oscillation frequency of the junction. Each inductor may be fixed or variable and may be tuned to the same or a different frequency. The inductors are preferably positioned to have the minimum mutual inductance therebetween. With no mutual inductance, the circuit through each junction operates essentially independently of each of the others. Each circuit oscillates when the applied voltage to its associated p-n junction swings through its negative resistance region, the lower voltage end of which is the critical peak voltage, $V_5$, $V_6$, $V_7$, $V_8$. Th output of the device may be radiated from the inductor in the oscillating circuit. This radiated output may be picked up by either a closely or a loosely coupled coil or antenna. There may of course be one or more coils or antennas for this purpose.

Another embodiment of the invention, illustrated in FIGURE 6, comprises a single crystal semiconductor body 51 with four negative resistance abrupt junctions 53, 55, 57 and 59, two of which are alloyed to each opposed face of the body. The body 51 and alloy junctions 53, 55, 57, and 59 may be the same type as that of FIGURE 4A. If the two junctions on each side are connected together to comprise two pairs of junctions and then each connected pair is connected into opposite sides of a variable voltage source 26, then the device exhibits the current-voltage characteristic shown in FIGURE 7. Note that there are two negative resistance regions, one on each side of the origin.

If now an inductor 63, 65, 67 and 69 is inserted in series with each junction 53, 55, 57 and 59 respectively, the circuit may function as an oscillator. The value of the inductance may be different for each inductor 63, 65, 67 and 69, being selected according to the frequency desired. The external inductance in combination with the capacitance of each junction determines the oscillation frequency. Note that, in the embodiment of FIGURE 6, both the magnitude and polarity of the input voltage and the internal series resistance dictates which junction will operate and hence which oscillation frequency will be selected.

The foregoing oscillator of FIGURE 4B and 6 may also be produced using the device of FIGURE 4A by connecting the junctions 33 and 35 together, 37 and 39 together and each pair connected to opposite sides of a variable voltage source as described with respect to FIGURE 6.

What is claimed is:

1. A circuit including a semiconductor device comprisin a single crystal body of semiconductor material and a plurality of abrupt p-n junctions in operative relationship therewith, each junction being less than 200 A. thick and both sides of said junctions having high concentrations of free charge carriers, each junction being characterized by exhibiting a voltage-controlled negative resistance characteristic when biased in a range of low voltage in the forward direction, a resonant circuit means connected to each of said junctions, and means for applying a variable voltage across two of said junctions, said circuit means including also a frequency-determining inductance in series with each of said junctions.

2. A circuit including a semiconductor device comprising a single crystal body of semiconductor material, a plurality of abrupt p-n junctions in operative relationship therewith, each junction being less than 200 A. thick and both sides of said junctions having high concentrations of free charge carriers, each junction being characterized by exhibiting a voltage-controlled negative resistance characteristic when biased in a range of low voltage in the forward direction, and a single non-rectifying connection contacting said body, first circuit means connecting said junctions without bias means therein, and second circuit means for applying a variable voltage across said first circuit means and said single non-rectifying connection.

3. A circuit including a semiconductor device comprising a single crystal body of semiconductor material, a plurality of abrupt p-n junctions in operative relationship therewith, each junction being less than 200 A. thick and both sides of said junctions having high concentrations of free charge carriers, each junction being characterized by exhibiting a voltage-controlled negative resistance characteristic when biased in a range of low voltage in the forward direction, and a non-rectifying connection contacting said body, first resonant circuit means connecting said junctions, and second biasing circuit means for applying a variable voltage across said first circuit means and said non-rectifying connection, said first circuit means including also a frequency-determining inductance in series with each of said junctions.

4. A circuit including a semiconductor device comprising a single crystal body of semiconductor material and a plurality of abrupt p-n junctions in operative relationship therewith, each junction being less than 200 A. thick and both sides of said junctions having high concentrations of free charge carriers, each junction being characterized by exhibiting a voltage-controlled negative resistance characteristic when biased in a range of low voltage in the forward direction, including means for directing light upon said body in a region between said non-rectifying connection and one of said p-n junctions, circuit means for biasing one of said junctions to a voltage just below its negative resistance characteristic region, and a load circuit connected between said one junction and another of said junctions.

References Cited by the Examiner

UNITED STATES PATENTS

| | | | |
|---|---|---|---|
| 2,790,088 | 4/57 | Shive | 307—88.5 |
| 2,832,898 | 4/58 | Camp | 307—88.5 |
| 2,862,416 | 12/58 | Doyle | 307—88.5 |
| 2,863,056 | 12/58 | Pankove | 331—115 |
| 2,914,665 | 11/59 | Linder | 307—88.5 |
| 2,927,221 | 3/60 | Armstrong | 307—88.5 |
| 2,958,022 | 10/60 | Pell | 307—88.5 |
| 2,975,377 | 3/61 | Price et al. | 307—88.5 |
| 2,983,854 | 5/61 | Pearson | 307—88.5 |
| 3,033,714 | 5/62 | Ezaki et al. | 317—235 |
| 3,053,998 | 9/62 | Chynoweth et al. | 307—88.5 |
| 3,089,038 | 5/63 | Rutz | 307—88.5 |

OTHER REFERENCES

Article: "Tunnel Diode as High-Frequency Device," by Somers, pages 1201–06 of P.I.R.E. for July 1959.

Article: "Tunnel Diode New Electronic Work Horse," pages 82, 83, 182 and 184–186 of Electronic Industries for August 1959.

Article: "Tunnel Diode: Big Impact," page 61 of Electronics, August 1959.

JOHN W. HUCKERT, *Primary Examiner.*

GEORGE N. WESTBY, ARTHUR GAUSS, *Examiners.*